(12) United States Patent
Yang

(10) Patent No.: US 6,905,899 B2
(45) Date of Patent: Jun. 14, 2005

(54) METHODS FOR FORMING A PHOTORESIST PATTERN USING AN ANTI-OPTICAL PROXIMITY EFFECT

(75) Inventor: Chin-Cheng Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/668,698

(22) Filed: Sep. 23, 2003

(65) Prior Publication Data

US 2005/0064728 A1 Mar. 24, 2005

(51) Int. Cl.⁷ .............................................. H01L 21/00
(52) U.S. Cl. ............................ 438/22; 438/48; 430/30
(58) Field of Search ........................... 438/22; 430/5, 430/30

(56) References Cited

U.S. PATENT DOCUMENTS 6,686,108 B2 * 2/2004 Inoue et al. .................. 430/30

* cited by examiner

*Primary Examiner*—Dung A. Le
(74) *Attorney, Agent, or Firm*—Stout, Uxa, Buyan & Mullins, LLP

(57) ABSTRACT

A method is providing for forming a semiconductor device including providing a substrate having a photoresist layer formed thereon, and providing a photomask over at least a portion of the photoresist layer, the photomask having a main pattern and an assist pattern. The method further includes transferring the main pattern to the photoresist layer, and forming a pattern on the substrate in such a way that excessively rounded corners caused by the optical proximity effect (OPE) are reduced.

26 Claims, 8 Drawing Sheets

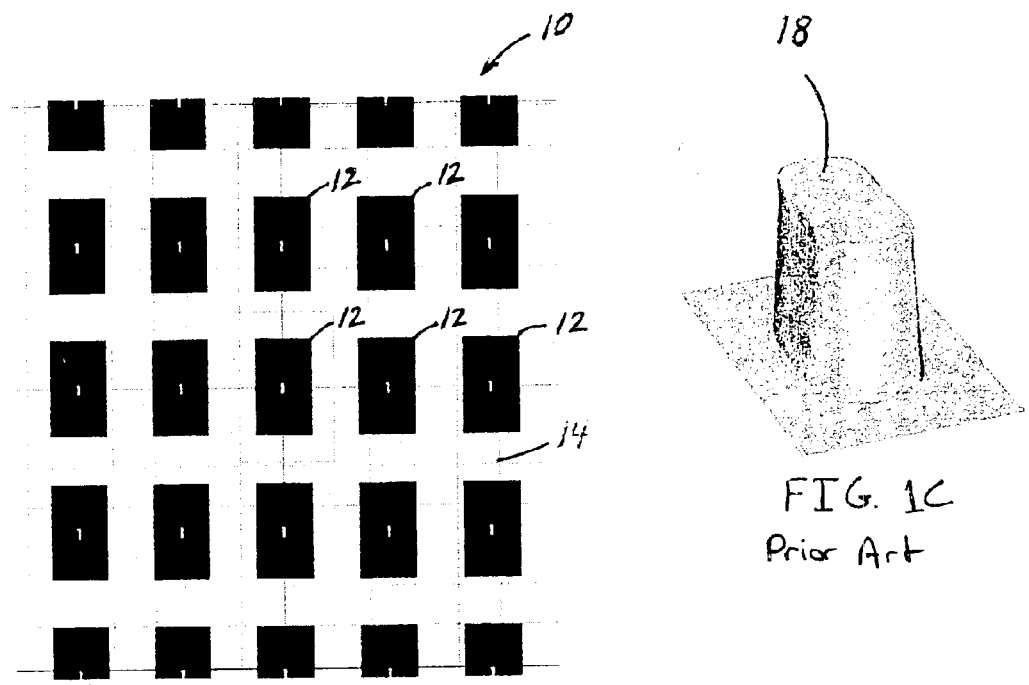
FIG 1A
Prior Art
FIG. 1C
Prior Art
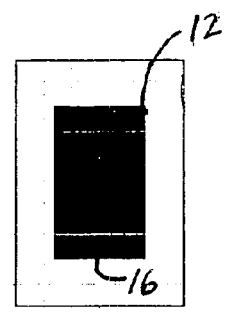
FIG. 1B
Prior Art

METHODS FOR FORMING A PHOTORESIST PATTERN USING AN ANTI-OPTICAL PROXIMITY EFFECT

BACKGROUND OF THE INVENTION

1. Field of the Invention

The present invention relates generally to methods for fabricating semiconductor devices and, more particularly, to methods for forming a photoresist pattern using an anti-optical proximity effect.

2. Description of Related Art

Photolithography is a common process or technique employed in the manufacture of semiconductor devices. Typically, a substrate or wafer is coated with a layer of light-sensitive material, such as a photoresist. Using a patterned photomask, the wafer is exposed to light that manifests a photochemical effect on the photoresist to produce a photoresist pattern, which is printed onto the photoresist.

The size and shape of the photoresist pattern may be different from the patterned photomask due to an optical proximity effect (OPE). The excessively rounded corners generally can lead to problems such as line shortening in which the length of the photoresist pattern is shortened. In addition, the excessively rounded corners may make it difficult to control the critical dimension of the photoresist pattern. Consequently, the quality and the yield of the semiconductor devices can be deteriorated.

One method of reducing excessively rounded corners is to perform multiple photolithography processes along with multiple etching processes to produce a rectangular photoresist pattern. This method, however, is more complicated and can require a greater amount of time and process steps to produce the resulting semiconductor device.

Another method of reducing excessively rounded corners is to provide an optical proximity correction (OPC) or an anti-OPE. The OPC is provided where the photoresist pattern printed on the photomask is distorted, and provides a predistortion at such locations in a direction opposite to a direction of curvature of the lens. Photomasks having such distorted patterns are known as optical proximity correction masks (OPCMs). However, even though the excessively rounded corners may be reduced using the OPC, the formed pattern still may not optimally form the desired shape, such as rectangle.

FIG. 1A is a top view of a prior art photomask 10 without OPC wherein main patterns 12 are used to block the light and are formed on a transparent photomask plate 14. FIG. 1B is an exploded top view of one of the main patterns 12 of FIG. 1A with the shape of a pattern 16 printed on a wafer 18 (see FIG. 1C) and superimposed on the main pattern 12. As shown in FIG. 1B, the shape of the main pattern 12 of the photomask 10 is a rectangle having sharp corners. However, the pattern 16, which is actually printed onto the wafer 18, has excessively rounded corners due to the OPE. In the three-dimensional view of FIG. 1C, the corners of the wafer 18 are excessively rounded, similarly to the excessively rounded corners in the pattern 16, due to the OPE. When the corners are excessively rounded as in the pattern 16, the length and width of the resulting structure formed in the wafer 18 may be shortened, thereby diminishing the quality and reliability of the semiconductor device. Accordingly, an OPC mask, an example of which is shown in FIG. 2A, may be utilized to attenuate some of the drawbacks described above.

In an attempt to alleviate the excessively rounded corners caused by the OPE, a number of subsidiary patterns 20 may be formed on the transparent photomask plate 14 to overlap each corner of the main pattern 12 to generate an improved prior art photomask 22, as shown in FIG. 2A. In particular, each main pattern 12 is combined with four subsidiary patterns 20 to thereby produce an improved pattern 24. Each subsidiary pattern 20 outwardly distorts from the edge of each corner of the main pattern 12 to compensate for the effect that when printing the pattern 16 onto the wafer 18, the shape of the printed pattern 16 has excessively rounded corners, thus being inwardly distorted compared to the main pattern 12. The corner rounding error of the pattern 16 (FIG. 1B) printed on the wafer 18 can be improved when using the improved pattern 24. FIG. 2B is an exploded top view of one of the improved patterns 24 of FIG. 2A with the shape of a pattern 26 being printed on the wafer 18 and superimposed on the improved pattern 24. Using the pattern 26 as a photomask, the wafer 18 is developed to form a three dimensional structure on the wafer 18, which is shown in FIG. 2C. The improved pattern 24 still does not produce a pattern 26 that has a rectangular shape. As shown in FIGS. 2B and 2C, the width and length of the pattern 26 can be wider and longer than that of the main pattern 12; thus the pattern 26 may be outwardly formed larger than the main pattern 12, causing what is called an under- or less-shoot. Furthermore, the corners of the pattern 26 are still excessively rounded.

A need thus exists in the prior art to develop methods for reducing the excessively rounded corners caused by the OPE. A further need exists to develop methods that can correct the over-shoot problem.

SUMMARY OF THE INVENTION

The present invention addresses these needs by providing a method for forming a semiconductor device using current lithography processes to correct and improve, for example, the OPE. In particular, an optical proximity correction photomask may be used in forming the semiconductor device wherein a pattern having reduced rounded corners is printed on a semiconductor substrate. The optical proximity correction photomask has the properties of a binary photomask, which is to provide a radiation (e.g., light) blocking layer and a radiation (e.g., light) projection layer, and thus advantageously provides reduced manufacturing costs and improved effectiveness.

In a preferred embodiment, and by way of example only, a method for forming a semiconductor device comprises providing a substrate having a photoresist layer formed thereon, and providing a photomask over at least a portion of the photoresist layer, the photomask having a main pattern and an assist pattern. The method further comprises transferring the main pattern to the photoresist layer, and forming a pattern on the substrate.

In another embodiment, a method for forming a pattern on a substrate comprises providing a substrate having a photoresist layer formed thereon, and providing a photomask on the photoresist layer, the photomask having a plurality of openings spaced apart from each other wherein at least a portion of the plurality of openings do not overlap. The method further comprises exposing the photomask to an energy field to transfer an image, which is defined by the plurality of openings, to the photoresist layer wherein the transferred image has a plurality of illuminated areas which correspond to the portion of the plurality of openings but which overlap, and forming a pattern using the image on the substrate.

In yet another embodiment, a lithography process comprises providing a substrate having a photoresist layer formed thereon, providing on the photoresist layer a photomask having at least four openings, and performing an over-exposure step to translate the at least four openings and a corresponding substantially rectangular image positioned between the at least four openings to the photoresist layer. The lithography process further comprises performing a development step to form a substantially rectangular photoresist pattern on the substrate.

Any feature or combination of features described herein is included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims.

BRIEF DESCIRPTION OF THE DRAWINGS

FIG. 1A is a top view of a prior art photomask without optical proximity correction wherein main patterns are used to block the radiation and are formed on a transparent photomask plate;

FIG. 1B is an exploded top view of one of the main patterns of FIG. 1A with the shape of a pattern printed on a wafer and superimposed on the main pattern;

FIG. 1C is a three dimensional view of the photoresist after the wafer has been developed:

DETAILED DESCRIPTION OF THE PRESENTLY PREFERRED EMBODIMENTS

Figure 2A:
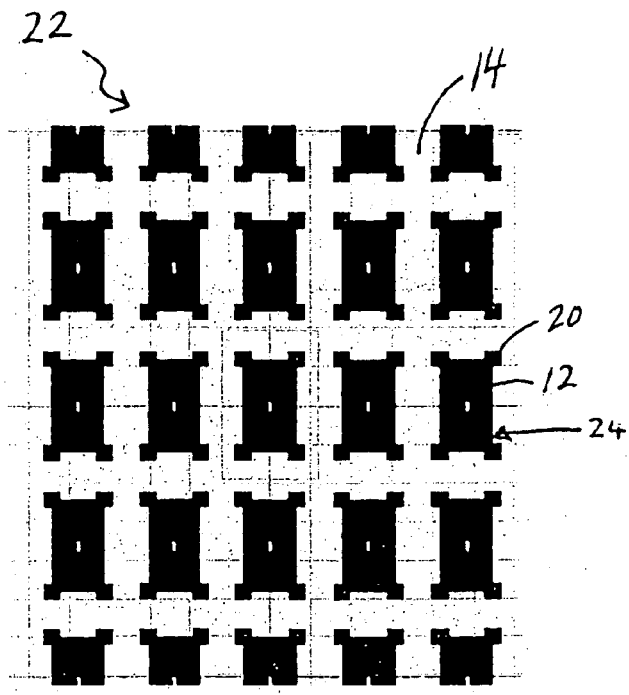
FIG. 2A is a top view of an improved prior art photomask with optical proximity correction wherein the photomask has subsidiary patterns formed on the transparent photomask plate to overlap each corner of the main pattern.
Figure 2C:
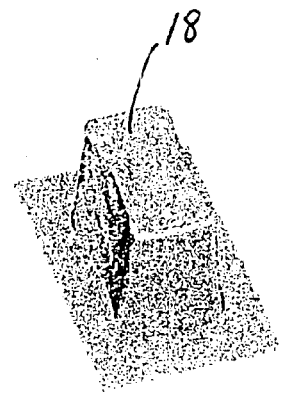
FIG. 2C is a three dimensional view of the photoresist after the wafer has been developed.
Figure 2B:
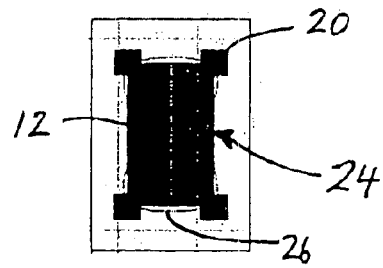
FIG. 2B is an exploded top view of one of the patterns of FIG. 2A with the shape of the pattern printed on the wafer and superimposed on the pattern.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of a photoresist pattern using a photomask having a main pattern and an assist pattern. The present invention may be practiced in conjunction with various photolithography techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to methods for forming a photoresist pattern using an anti-OPE.

Figure 3:
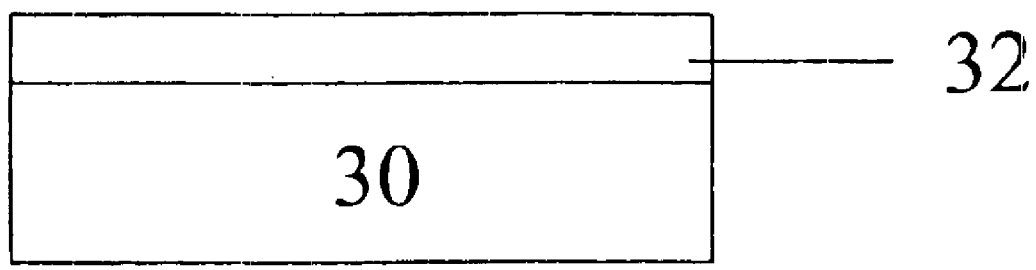
FIG. 3 is a cross-sectional view of a substrate with a photoresist layer formed thereon in accordance with an illustrated embodiment of the present invention.

Referring in particular to FIG. 3, a cross-sectional view of a substrate or wafer 30 having a photoresist layer 32 formed thereon is depicted. Preferably, the substrate 30 may be made of a single crystalline silicon material. Alternatively, the substrate 30 can be made of materials such as gallium nitride (GaN), gallium arsenide (GaAs), or other materials commonly recognized as suitable semiconductor materials to those skilled in the art. The substrate 30 can be slightly doped with p-type dopants (e.g., arsenic, phosphorus, and antimony) or n-type dopants (e.g., boron and boron difluoride).

The photoresist layer 32 can be formed on the substrate 30 using, for example, any photolithography process known to those skilled in the art. To form the photoresist layer 32, a photosensitive film, i.e., photoresist, is spin-deposited across the substrate 30.

Figure 4:
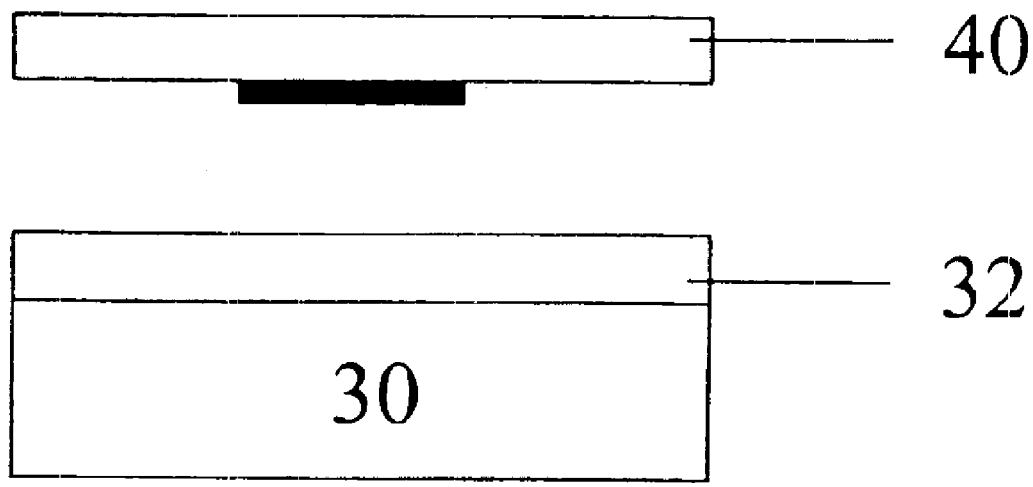
FIG. 4 is a cross-sectional view of the configuration depicted in FIG. 3 wherein a photomask is positioned over the photoresist layer to selectively expose a portion of the photoresist layer in accordance with an illustrated embodiment of the present invention.

FIG. 4 is a cross-sectional view of a mask 40, e.g., a photomask, positioned over the photoresist layer 32 to selectively expose a portion of the photoresist layer 32. The design, layout, and configuration of the photomask 40 can attenuate, and, preferably, eliminate, corner rounding on the pattern and can form a relatively fine pattern having overshoot compared to conventional optical proximity correction photomasks. The photomask 40 is capable of correcting the OPE and may be referred to as an anti-OPE. Several applications of the photomask 40 will be shown in FIGS. 5–11 and described throughout this specification. One skilled in the art will be able to modify, combine, and omit various features of one or more of the photomasks and/or mask-projected patterns 40, 50, 70, 80, 90, 100 and 110 while still maintaining the spirit and scope of the present invention.

Figures 5, 6:
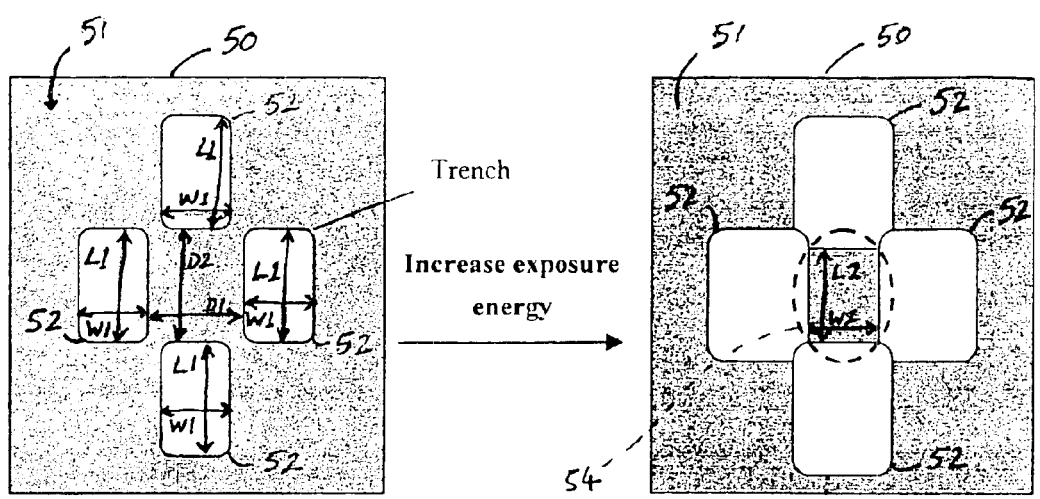
FIG. 5 is a plane layout diagram illustrating a photomask-projected pattern positioned over the photoresist layer in accordance with a first illustrated embodiment of the present invention.
FIG. 6 is a plane layout diagram illustrating the photomask-projected pattern wherein the rounded corners of adjacent trench patterns overlap to form a rectangle pattern in accordance with the first illustrated embodiment of the present invention.

FIG. 5 is a plane layout diagram illustrating a photomask-projected pattern 50 from a photomask 40 positioned over the photoresist layer 32 (FIG. 4). The photomask-projected pattern 50 has a number of irradiated areas or trench patterns 52 wherein in the illustrated embodiment each illuminated area 52 can have a length L1 of about 300 nanometers (nm) and a width W1 of about 600 nm. Each dimension L1 and W1 corresponds to an opening in the photomask which can have a length and width of 270 nm and 550 nm, respectively. In the illustrated embodiment, the photomask-projected pattern 50 comprises four irradiated areas, e.g., trench patterns 52, which are spaced apart from one another. Initially, the distance between the trench patterns 52 is defined by D1, which in the illustrated embodiment can be about 330 nm, and D2, which in the illustrated embodiment can be about 650 nm. Area 51 of the photomask-projected pattern 50 corresponds to a radiation-blocking portion of the photomask 40, and the trench patterns 52 correspond to areas beneath the photomask 40 (e.g., areas of the underlying photoresist layer 32) that are exposed to radiation. The radiation-blocking portion of the photomask in the illustrated embodiment can comprise a quartz/Cr/CrOx material or any other material recognized as suitable to those skilled in the art for attenuating or eliminating an exposure relative to an exposure passing through openings in the photomask.

Since the photomask-projected pattern 50, as illustrated, does not include any assist patterns (discussed below), corner rounding on the trench patterns 52 may occur. The corner rounding on the trench patterns 52, however, can be attenuated or eliminated in accordance with an aspect of the present invention by exposing the photomask 40 to radiation energy, e.g., light energy, at an enhanced exposure energy and/or an extended time period. For example, as the exposure energy or the exposure time increases, the sizes of the trench patterns 52 increase, and the rounded corners of adjacent trench patterns 52 begin to overlap, which forms a pattern 54, e.g., a rectangular pattern, as shown in FIG. 6. In accordance with an aspect of the present invention, the photomask-projected pattern 50 and the photoresist layer 32 are exposed to radiation for a time period sufficient to facilitate overlapping and, in the illustrated embodiment for a time period of between about 0.1 seconds and 2.0 seconds, and in a particular example, for a time period of about 0.5 seconds. The exposure energy, for example, of the light, is preferably between about 20 milli-joule/square centimeter ($mJ/cm^2$) and 50 $mJ/cm^2$, and in a particular example about 35 $mJ/cm^2$. As shown in the illustrated embodiment, the rectangular pattern 54 is formed between the four adjacent trench patterns 52 without any rounded corners. In one application, the underlying photoresist comprises positive photoresist, so that the rectangular pattern 54 remains polymerized after exposure. In one embodiment, the pattern 54 can have a length L2 that is between about 540 nm and 600 nm, and in a particular example 580 run, and a width W2 that is between about 260 nm and 300 nm, and in a particular example 280 nm.

Figure 7A:
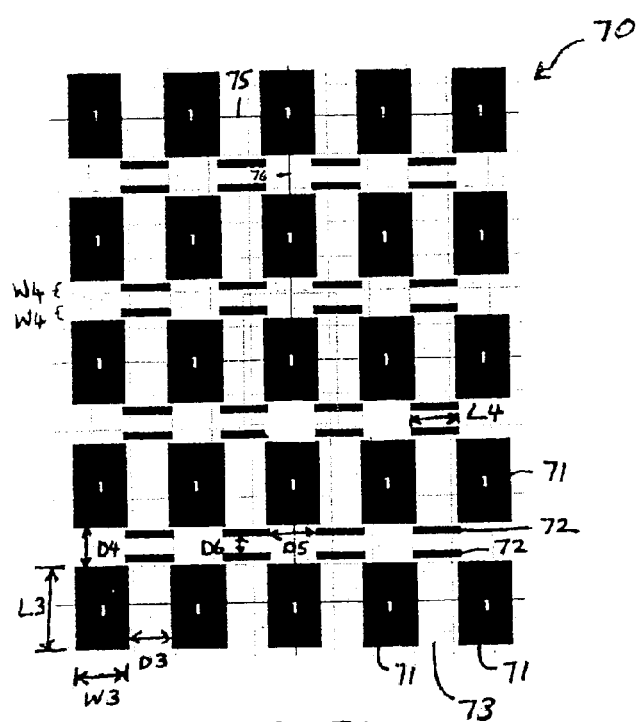
FIG. 7A is a plane layout diagram illustrating a photomask that can be positioned over the photoresist layer wherein the photomask can include a plurality of main features and a plurality of assist features, all of which can be formed on a transparent photomask plate in accordance with a second illustrated embodiment of the present invention.

FIG. 7A is a plane layout diagram illustrating a photomask 70 that can be positioned over the photoresist layer 32 (FIG. 4) wherein the photomask 70 can include at least one main pattern 71 and at least one assist pattern 72, both of which can be formed on a transparent photomask plate 73. The main pattern 71 and the assist pattern 72 can be shaded to block the radiation so that the radiation is unable to reach certain portions of the underlying photoresist layer 32 and the substrate 30. The portions of the transparent photomask plate 73 that are not covered by the main patterns 71 and the assist patterns 72 allow radiation to pass through to expose the photoresist layer 32.

In the illustrated embodiment, the main pattern 71 can have a length L3 that is between about 800 nm and 1000 nm, and in a particular example 900 nm, and a width W3 that is between about 300 nm and 360 nm, and in a particular example 330 nm. Adjacent main patterns 71 are distances D3 and D4 apart from one another. For example, D3 can be between about 240 nm and 300 nm, and in a particular example 270 nm, and D4 can be between about 240 nm and 300 nm, and in a particular example 270 nm.

Figure 7C:
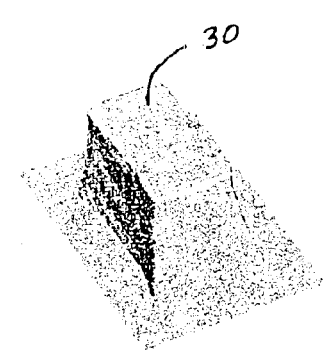
FIG. 7C is a three dimensional view of the photoresist after the wafer has been developed shown in FIG. 7B in accordance with the second illustrated embodiment of the present invention.
Figure 7B:
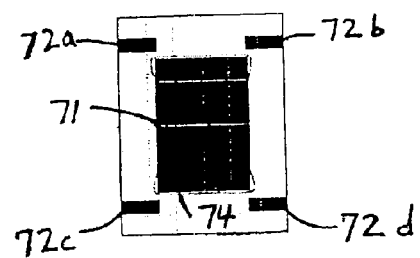
FIG. 7B is an exploded top view of a portion of the photomask of FIG. 7A with a resulting pattern, which is printed on the substrate, illustrated as being superimposed on the main pattern in accordance with the second illustrated embodiment of the present invention.

FIG. 7B is an exploded top view of a portion of the photomask 70 of FIG. 7A with a resulting pattern 74, which is printed on the substrate 30, illustrated as being superimposed on the main pattern 71. As shown in FIG. 7B, the outline of the resulting pattern 74 is substantially similar to the outline of the main pattern 71. Using the photomask 70, the resulting pattern 74 extends slightly beyond the outline of the main pattern 71 near the corners of the main pattern 71. FIG. 7C is a three dimensional view of the photoresist 32 after the substrate 30 has been developed using the photomask 70 shown in FIG. 7B. As shown in FIG. 7C, the corners of the substrate 30 are not excessively rounded.

Referring back to FIG. 7A, the assist patterns 72 can be provided on the transparent photomask plate 73 and can be located adjacent to or near at least one corner of one or more of the main patterns 71. In the illustrated embodiments, each assist pattern 72 may not overlap or contact any of the main patterns 71. Each assist pattern 72 is a like-scattering bar. As shown in FIG. 7A, each assist pattern 72 extends along the corners of the main patterns 71, for example, from one corner of a main pattern 71 to one corner of another main pattern 71. The assist patterns 72 attenuate and, preferably, eliminate the excessively rounded corners present in conventional OPC techniques. In one embodiment, the transparent regions located around the main patterns 71 and the assist patterns 72 are similar to the trench patterns 52 (see also FIGS. 5 and 6). In the illustrated embodiment, each assist pattern 72 can have a length L4 that is between about 280 nm and 360 nm, and in a particular example 320 nm, and a width W4 that is between about 60 nm and 80 nm, and in a particular example 70 nm. Adjacent assist patterns 72 are disposed distances D5 and D6 apart from one another. For example, D5 can be between about 100 nm and 400 nm, and in a particular example 280 nm, and D6 can be between about 100 nm and 260 nm, and in a particular example 180 nm. The surface area of the assist patterns 72 can be between about 0.1 percent and 10 percent of the surface area of the main patterns 71.

FIG. 7A depicts horizontal lines 75 that are substantially perpendicular to vertical lines 76 for the purpose of describing the orientation of the main patterns 71 relative to the assist patterns 72. For example, in one embodiment, the longer sides of the main patterns 71 are oriented to be substantially parallel with the vertical lines 76 and the longer sides of the assist patterns 72 are oriented to be substantially parallel with the horizontal lines 75. Referring to FIG. 7B, the left edge of the main pattern 71 is substantially in line with the right edges of the assist patterns 72a and 72c. Similarly, the right edge of the main pattern 71 is substantially in line with the left edges of the assist patterns 72b and 72d.

Figure 8A:
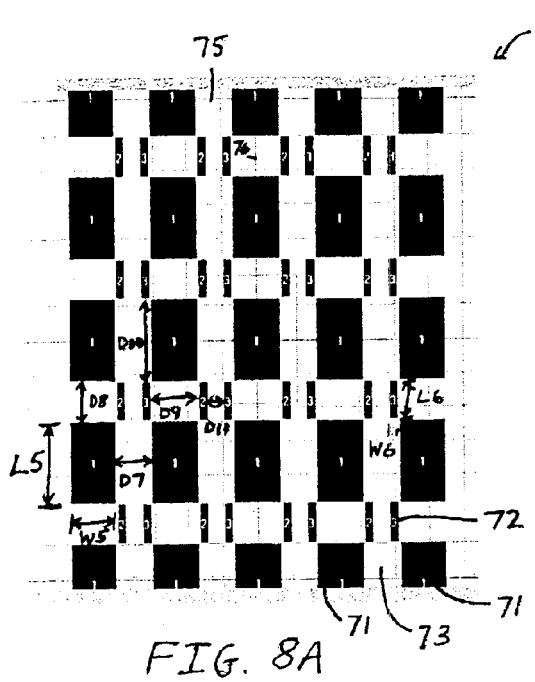
FIG. 8A is a plane layout diagram illustrating a photomask that can be positioned over the photoresist layer wherein the photomask can include at least one main pattern and at least one assist pattern, both of which can be formed on the transparent photomask plate in accordance with a third illustrated embodiment of the present invention.

FIG. 8A is a plane layout diagram illustrating a photomask 80 that can be positioned over the photoresist layer 32 (FIG. 4) wherein the photomask 80 can include at least one main pattern 71 and at least one assist pattern 72, both of which can be formed on the transparent photomask plate 73. The design, layout, and configuration of the photomask 80 are similar to the design, layout, and configuration of the photomask 70. Therefore, many of the similar features of the photomask 80 are discussed above with reference to FIGS. 7A–7C, and a number of different features between the photomask 80 and the photomask 70 are discussed below. For instance, as shown in FIG. 8A, the longer sides of the main patterns 71 are oriented to be substantially parallel with the vertical lines 76, and the longer sides of the assist patterns 72 are also oriented to be substantially parallel with the vertical lines 76.

In the illustrated embodiment, each main pattern 71 can have a length L5 that is between about 800 nm and 1000 nm, and in a particular example 900 nm, and a width W5 that is between about 300 nm and 360 nm, and in a particular example 330 nm. In the illustrated embodiment, each assist pattern 72 can have a length L6 that is between about 280 nm and 360 nm, and in a particular example 320 nm, and a width W6 that is between about 60 nm and 80 nm, and in a particular example 70 nm. Adjacent main patterns 71 are distances D7 and D8 apart from one another. For example, D7 can be between about 240 nm and 300 nm, and in a particular example 270 nm, and D8 can be between about 240 nm and 300 nm, and in a particular example 270 nm. Adjacent assist patterns 72 are distances D9, D10 and D11 apart from one another. For example, D9 can be between about 100 nm and 400 nm, and in a particular example 320 nm, D10 can be between about 850 nm and 950 nm, and in a particular example 900 nm, and D11 can be between about 100 nm and 260 nm, and in a particular example 180 nm.

Figure 8C:
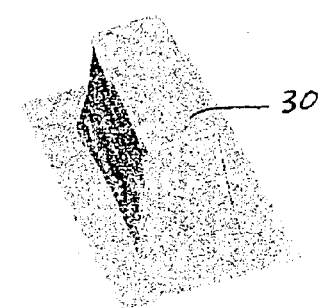
FIG. 8C is a three dimensional view of the substrate after the photoresist has been developed shown in FIG. 8B in accordance with the third illustrated embodiment of the present invention.
Figure 8B:
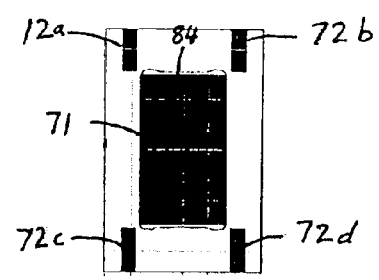
FIG. 8B is an exploded top view of a portion of the photomask of FIG. 8A with a resulting pattern, which is printed on the substrate, illustrated as being superimposed on the main pattern in accordance with the third illustrated embodiment of the present invention.

FIG. 8B is an exploded top view of a portion of the photomask 80 of FIG. 8A with a resulting pattern 84, which is printed on the substrate 30, illustrated as being superimposed on the main pattern 71. As shown in FIG. 8B, the outline of the resulting pattern 84 is substantially similar to the outline of the main pattern 71. Using the photomask 80, the resulting pattern 84 extends slightly beyond the outline of the main pattern 71 near the corners of the main pattern 71. FIG. 8C is a three dimensional view of the photoresist 32 after the photoresist 32 has been developed As shown in FIG. 8C, the corners of the photoresist 32 are not excessively rounded.

Figure 9:
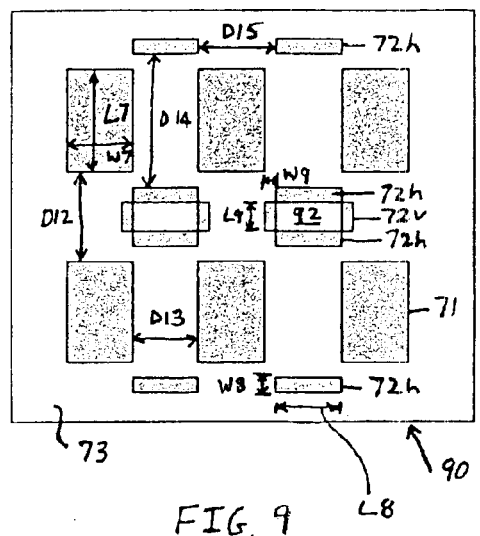
FIG. 9 is a plane layout diagram illustrating a photomask that can be positioned over the photoresist layer wherein the photomask can include at least one main pattern and at least one assist pattern, both of which can be formed on the transparent photomask plate in accordance with a fourth illustrated embodiment of the present invention.

FIG. 9 is a plane layout diagram illustrating a photomask 90 that can be positioned over the photoresist layer 32 (FIG. 4) wherein the photomask 90 can include at least one main pattern 71 and at least one assist pattern 72, both of which can be formed on the transparent photomask plate 73. Many of the similar features of the photomask 90 are discussed above with reference to FIGS. 7A–7C, and a number of different features between the photomask 90 and the photomask 70 are discussed below. As shown in FIG. 9, the photomask 90, the main patterns 71, and the assist patterns 72 can have different configurations, sizes, e.g., lengths and widths, and shapes. For example, the horizontally positioned assist patterns 72li can have one size, and the vertically positioned assist patterns 72v can have another size. From viewing the assist patterns 72 located in the middle of FIG. 9, it can be seen that the assist patterns 72 form a rectangular pattern 92 and the assist patterns 72h are in close proximity to and, preferably, in contact with the assist patterns 72v. In one embodiment, the assist patterns 72 can be overlapping.

With reference to the illustrated embodiments, in addition to the vertically positioned assist patterns having different sizes and shapes relative to the horizontally positioned assist patterns, the vertically positioned assist patterns may have different sizes, shapes and/or orientations relative to one another, as may the horizontally positioned assist patterns have different sizes, shapes and/or orientations relative to one another. Similarly, other combinations of main pattern sizes, shapes and orientations other than those illustrated are contemplated.

In the illustrated embodiment of FIG. 9, each main pattern 71 can have a length L7 that is between about 800 nm and 2400 nm, and in a particular example 1600 run, and a width W7 that is between about 800 nm and 1600 nm, and in a particular example 1200 run. In the illustrated embodiment, each assist pattern 72h can have a length L8 that is between about 1600 nm and 800 nm, and in a particular example 1200 run, and a width W8 that is between about 60 nm and 80 nm, and in a particular example 70 nm. Also, as shown in FIG. 9, each assist pattern 72v can have a length L9 that is between about 600 run and 1400 run, and in a particular example 1000 nm, and a width W9 that is between about 60 nm and 80 run, and in a particular example 70 run. Adjacent main patterns 71 are distances D12 and D13 apart from one another. For example, D12 can be between about 800 nm and 1600 run, and in a particular example 1200 inn, and D13 can be between about 800 nm and 1600 run, and in a particular example 1200 run. Adjacent assist patterns 72 are distances D14 and D15 apart from one another. For example, D14 can be between about 800 nm and 2400 nm, and in a particular example 1600 nm, and D15 can be between about 800 nm and 1600 nm, and in a particular example 1200 nm.

Figure 10:
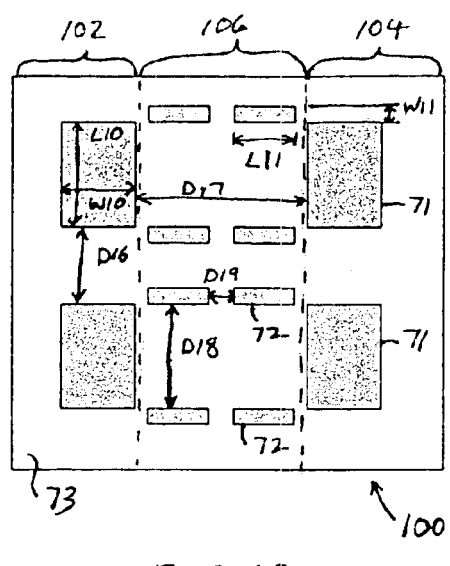
FIG. 10 is a plane layout diagram illustrating a photomask that can be positioned over the photoresist layer wherein the photomask can include at least one main pattern and at least one assist pattern, both of which can be formed on the transparent photomask plate in accordance with a fifth illustrated embodiment of the present invention.

FIG. 10 is a plane layout diagram illustrating a photomask 100 that can be positioned over the photoresist layer 32 (FIG. 4) wherein the photomask 100 can include at least one main pattern 71 and at least one assist pattern 72, both of which can be formed on the transparent photomask plate 73. Many of the similar features of the photomask 100 are discussed above with reference to FIGS. 7A–7C and different features between the photomask 100 and the photomask 70 are discussed below. As shown in FIG. 10, the photomask 100, the main patterns 71, and the assist patterns 72 can have various combinations of different configurations, sizes, e.g., lengths and widths, shapes, and orientations. For example, the main patterns 71 can be positioned within the left and right portions 102 and 104 of the photomask 100, and the assist patterns 72 can be positioned within the middle portion 106 of the photomask 100.

In the illustrated embodiment, each main pattern 71 can have a length L10 that is between about 800 nm and 2400 nm, and in a particular example 1600 nm, and a width W10 that is between about 800 nm and 1600 nm, and in a particular example 1200 nm. In the illustrated embodiment, each assist pattern 72 can have a length L11 that is between about 800 nm and 1600 nm, and in a particular example 1200 nm, and a width W11 that is between about 60 nm and 80 nm, and in a particular example 70 nm. Adjacent main patterns 71 are distances D16 and D17 apart from one another. For example, D16 can be between about 400 nm and 800 nm, and in a particular example 600 run, and D17 can be between about 1800 nm and 5000 nm, and in a particular example 3400 nm. Adjacent assist patterns 72 are distances D18 and D19 apart from one another. For example, D18 can be between about 800 nm and 2400 nm, and in a particular example 1600 nm, and D19 can be between about 120 nm and 3600 nm, and in a particular example 800 nm.

Figure 11:
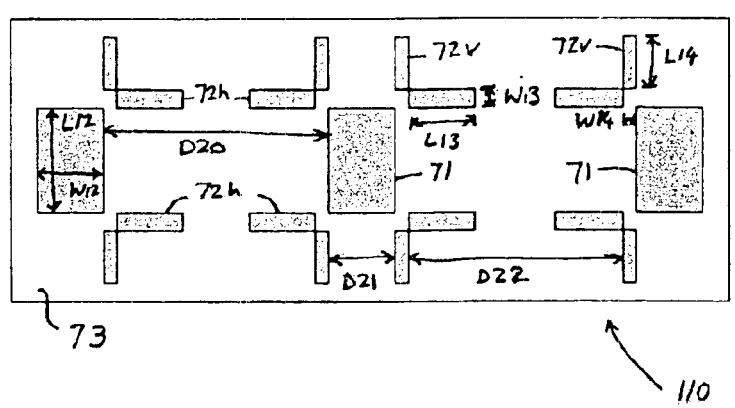
FIG. 11 is a plane layout diagram illustrating a photomask that can be positioned over the photoresist layer wherein the photomask can include at least one main pattern and at least one assist pattern, both of which can be formed on the transparent photomask plate in accordance with a sixth illustrated embodiment of the present invention.
Figure 12:
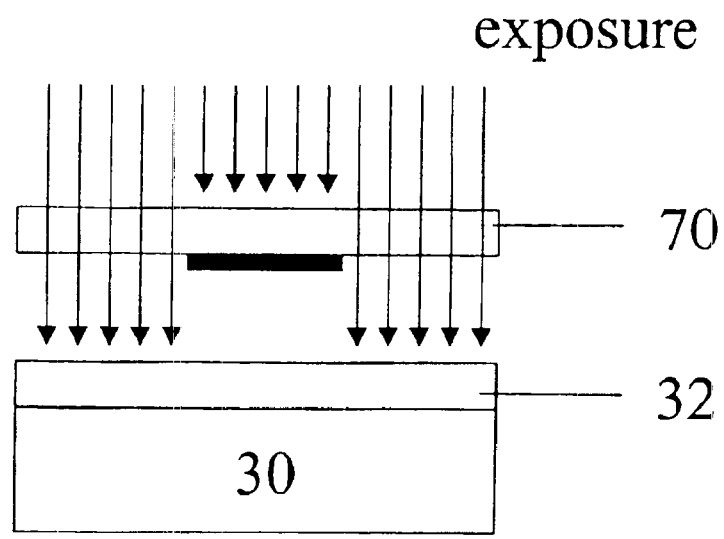
FIG. 12 shows the photoresist layer being exposed to radiation through the photomask for transferring the main pattern to the photoresist layer in accordance with an illustrated embodiment of the present invention.

FIG. 11 is a plane layout diagram illustrating a photomask 110 that can be positioned over the photoresist layer 32 (FIG. 4) wherein the photomask 110 can include at least one main pattern 71 and at least one assist pattern 72, both of which can be formed on the transparent photomask plate 73. Many of the similar features of the photomask 110 are discussed above with reference to FIGS. 7A–7C, and a number of different features between the photomask 110 and the photomask 70 are discussed below. As shown in FIG. 11, the photomask 110, the main patterns 71, and the assist patterns 72 can have different combinations of configurations, sizes, e.g., lengths and widths, shapes, and orientations. For example, the horizontally positioned assist patterns 72h can have one size, and the vertically positioned assist patterns 72v can have another size. In the illustrated embodiment, horizontally positioned assist patterns 72h are in close proximity to and, preferably, in contact with, corresponding vertically positioned assist patterns 72v. In one embodiment, the assist patterns 72h, 72v can be overlapping.

In the illustrated embodiment, each main pattern 71 has a length L12 that is between about 800 nm and 2400 nm, and in a particular example 01600 nm, and a width W12 that is between about 800 nm and 1600 nm, and in a particular example 1200 nm. In the illustrated embodiment, each assist pattern 72h has a length L13 that is between about 800 nm and 1600 nm, and in a particular example 1200 nm, and a width W13 that is between about 60 nm and 80 nm, and in a particular example 70 nm. Also, as shown in FIG. 11, each assist pattern 72v has a length L14 that is between about 400 nm and 600 nm, and in a particular example 800 nm, and a width W14 that is between about 60 nm and 80 nm, and in a particular example 70 nm. Adjacent main patterns 71 are a distance D20 apart from one another. For example, D20 can be between about 1600 nm and 5000 nm, and in a particular example 2000 nm. Adjacent assist patterns 72v are distances D21 and D22 apart from one another. For example, D21 can be between about 600 nm and 1800 nm, and in a particular example 1200 nm, and D22 can be between about 1600 nm and 5000 nm, and in a particular example 2000 nm.

After the photomask, for example photomask 70 (FIG. 7A), is positioned over the photoresist layer 32 (FIG. 4), the photoresist layer 32 is exposed to energy, e.g., light, through the photomask 70 for transferring or translating the main patterns 71 to the photoresist layer 32 by development process. The photoresist layer 32 can be exposed to the energy for a time period that is between about 10% and 30% greater than a normal exposure time. This is often referred to as an over-exposure of the photoresist layer 32 or an over-exposure step. In the illustrated embodiment, the assist patterns 72 will not be formed at or on photoresist layer 32 after the development process. The photoresist layer 32 is exposed to the energy preferably for a time period of between about 0.1 seconds and 2.0 seconds, and in a particular example for a time period of about 0.5 seconds, wherein the exposure energy is between about 20 millijoule/square centimeter (mJ/cm$^2$) and 50 mJ/cm$^2$, and in a particular example about 35 mJ/cm$^2$.

Figure 13:
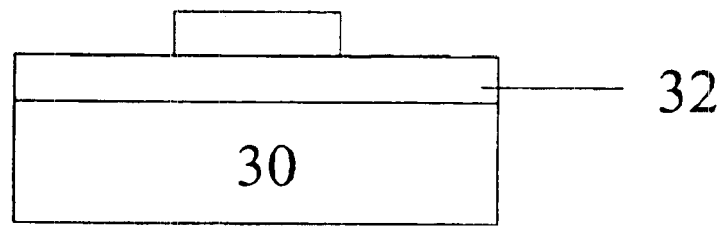
FIG. 13 shows portions of the photoresist layer having been developed to form a photoresist pattern on the substrate in accordance with an illustrated embodiment of the present invention.
Figure 14:
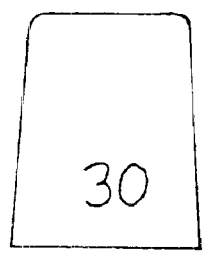
FIG. 14 shows a pattern formed in the substrate in accordance with an illustrated embodiment of the present invention.

The portions of the photoresist layer 32 having a high solubility (e.g., the exposed portions for a positive photoresist) typically are removed by using a developer solution (typically referred to as development or a development process) and the portions of the photoresist layer 32 having a low solubility remain, to thereby form at least one pattern 130, for example, a rectangular photoresist pattern, on the substrate 30, as shown in FIG. 13. The portions of the substrate 30, now exposed due to removal of photoresist during formation of the pattern 130, can be etched to form a pattern in the substrate 30. Subsequently, the remaining photoresist pattern 130 can be removed, using for example a plasma ashing process such as O2 plasma ashing, to obtain a desired pattern having a desired dimension.

In view of the foregoing, it will be understood by those skilled in the art that the methods of the present invention can facilitate formation of semiconductor devices, and in particular methods for forming a photoresist pattern using an anti-optical proximity effect. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method, comprising:
providing a substrate having a photoresist layer formed thereon;
providing a photomask over at least a portion of the photoresist layer, the photomask having a shaded main pattern and shaded assist patterns disposed at corners of but not overlapping the main pattern;
transferring the main pattern to the photoresist layer; and
forming a pattern on the substrate.

2. The method as set forth in claim 1, wherein:
the main pattern comprises a rectangular shape having corners; and
the assist patterns are disposed at each of the corners of the main pattern.

3. The method as set forth in claim 1, wherein:
the main pattern and the assist patterns are shaded to block radiation from reaching a portion of the photoresist layer;
the main pattern and the assist patterns are formed on a transparent photomask plate; and
the assist patterns comprise like-scattering bars.

4. The method as set forth in claim 1, wherein:
the main pattern is shaded to block radiation from reaching a first portion of the photoresist layer;
the assist patterns allows radiation to pass to a second portion of the photoresist layer;
the main pattern and the assist patterns are formed on a transparent photomask plate; and
the assist patterns are like-scattering bars.

5. The method as set forth in claim 1, wherein the assist patterns do not contact the main pattern.

6. The method as set forth in claim 1, wherein:
the assist patterns are like-scattering bars; and
the main pattern and the assist patterns have rectangular shapes.

7. The method as set forth in claim 1, wherein:
the main pattern has a length and a width, the length being greater than the width;
the assist patterns have widths and lengths that are greater than the widths;
the length of the main pattern is oriented substantially parallel to the lengths of the assist patterns; and
the width of each of the assist patterns is between about 60 nanometers and 80 nanometers.

8. The method as set forth in claim 1, wherein:
the main pattern has a length and a width, the length being greater than the width;
the assist patterns have widths and lengths that are greater than the widths;
the length of the main pattern is oriented substantially perpendicular to the lengths of the assist patterns; and
the length of each of the assist features is greater than one-half the width of the main pattern.

9. The method as set forth in claim 1, wherein:
the transferring of the main pattern to the photoresist layer comprises performing an exposure process on the main pattern;
the exposure process does not transfer the assist patterns to the photoresist layer; and
the exposure process is performed for between about 0.1 seconds and 2.0 seconds.

10. The method as set forth in claim 1, wherein:
the transferring of the main pattern to the photoresist layer comprises performing an exposure process on the main pattern; and
the exposure process comprises exposure to energy of between about 20 milli-joule/square centimeter and 50 milli-joule/square centimeter.

11. The method as set forth in claim 1, wherein:
the transferring of the main pattern to the photoresist layer comprises exposing the main pattern to energy ranging from between about 20 milli-joule/square centimeter to 50 milli-joule/square centimeter; and
the exposing of the main pattern to energy is for between about 0.1 seconds and 2.0 seconds.

12. The method as set forth in claim 1, wherein:
the transferring of the main pattern to the photoresist layer comprises projecting radiation toward the main pattern;
the forming of the pattern on the photoresist comprises removing a portion of the photoresist layer using a developer solution; and
the forming of the pattern on the substrate comprises forming a rectangular photoresist pattern on the substrate.

13. A structure formed using the method of claim 1.

14. A structure formed using the method of claim 2.

15. A method for forming a pattern on a substrate, comprising;
providing a substrate having a photoresist layer formed thereon;
providing a photomask having a plurality of openings on the photoresist layer, wherein at least a portion of the plurality of openings do not overlap;
exposing the photomask to an energy field to transfer an image, which is defined by the plurality of openings, to the photoresist layer, wherein the transferred image has a plurality of illuminated areas which correspond to the portion of the plurality of openings but which overlap; and forming a pattern using the image on the substrate.

16. The method of claim 15, wherein at least one of the plurality of openings is spaced apart from at least another one of the plurality of openings.

17. The method of claim 15, wherein:
the plurality of openings comprises first, second, third and fourth openings, the first opening being positioned across from the third opening and the second opening being positioned across from the fourth opening;
the transferred image has first, second, third and fourth illuminated areas that correspond to the first, second, third and fourth openings; and
the exposing of the photomask to the energy field causes a corner of the first illuminated area to overlap with a corner of the second illuminated area, a corner of the second illuminated area to overlap with a corner of the third illuminated area, a corner of the third illuminated area to overlap with a corner of the fourth illuminated area, and a corner of the fourth illuminated area to overlap with a corner of the first illuminated area, resulting in the image being defined by the first, second, third and fourth illuminated areas.

18. The method of claim 15, wherein:
the energy field comprises energy ranging from between about 20 milli-joule/square centimeter to 50 milli-joule/square centimeter; and the exposing of the photomask to the energy field is for between about 0.1 seconds and 2.0 seconds.

19. The method of claim 15, wherein:

the image is a substantially rectangular image; and the forming of the pattern using the image on the photoresist comprises performing a development process.

20. The method of claim 15, wherein:

the image is a substantially rectangular image; and the pattern is a substantially rectangular photoresist pattern.

21. A structure formed using the method of claim 15.

22. A structure formed using the method of claim 17.

23. A lithography process, comprising:

providing a substrate having a photoresist layer formed thereon;

providing on the photoresist layer a photomask having at least four openings;

performing an over-exposure step to translate the at least four openings and a corresponding substantially rectangular image positioned between the at least four openings to the photoresist layer; and performing a development step to form a substantially rectangular photoresist pattern on the substrate.

24. A method, comprising:

providing a substrate having a photoresist layer formed thereon;

providing a photomask over at least a portion of the photoresist layer, the photomask having a main pattern and an assist pattern formed on a transparent photomask plate, the main pattern being shaded to block radiation from reaching a first portion of the photoresist layer and the assist pattern comprising a like-scattering bar and allowing radiation to pass to a second portion of the photoresist layer;

transferring the main pattern to the photoresist layer; and forming a pattern on the substrate.

25. A method, comprising:

providing a substrate having a photoresist layer formed thereon;

providing a photomask over at least a portion of the photoresist layer, the photomask having a main pattern and an assist pattern, the main pattern having a width and a length that is greater than the width, and the assist pattern having a width and a length that is greater than the width, wherein the length of the main pattern is oriented substantially parallel to the length of the assist pattern and the width of the assist pattern is between about 60 nanometers and 80 nanometers;

transferring the main pattern to the photoresist layer, and forming a pattern on the substrate.

26. A method, comprising:

providing a substrate having a photoresist layer formed thereon;

providing a photomask over at least a portion of the photoresist layer, the photomask having a main pattern and an assist pattern, the main pattern having a width and a length that is greater than the width and the assist pattern having a width and a length that is greater than the width, wherein the length of the main pattern is oriented substantially perpendicular to the length of the assist pattern and the length of the assist feature is greater than one-half the width of the main pattern;

transferring the pattern to the photoresist layer; and forming a pattern on the substrate.

* * * * *